United States Patent
Lee et al.

(10) Patent No.: US 8,711,545 B2
(45) Date of Patent: Apr. 29, 2014

(54) MULTILAYERED CERAMIC ELECTRONIC COMPONENT AND FABRICATION METHOD THEREOF

(71) Applicant: Samsung Electro-Mechanics Co., Ltd., Suwon (KR)

(72) Inventors: Chung Eun Lee, Gyunggi-do (KR); Jae Yeol Choi, Gyunggi-do (KR); Doo Young Kim, Gyunggi-do (KR); Wi Heon Kim, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 13/950,676

(22) Filed: Jul. 25, 2013

(65) Prior Publication Data
US 2013/0308246 A1 Nov. 21, 2013

Related U.S. Application Data

(63) Continuation of application No. 13/353,068, filed on Jan. 18, 2012, now Pat. No. 8,526,163.

(30) Foreign Application Priority Data

Nov. 2, 2011 (KR) ........................ 10-2011-0113546

(51) Int. Cl.
*H01G 4/06* (2006.01)
(52) U.S. Cl.
USPC .................. 361/321.1; 361/306.1; 361/306.3; 361/301.4; 361/305
(58) Field of Classification Search
USPC ........... 361/321.1, 321.2, 303–305, 311–313, 361/306.1, 306.3, 301.2, 301.4
See application file for complete search history.

(56) References Cited

U.S. PATENT DOCUMENTS

| 6,069,786 A | 5/2000 | Horie et al. |
| 6,292,351 B1 | 9/2001 | Ahiko et al. |

(Continued)

FOREIGN PATENT DOCUMENTS

| JP | 05-068835 A | 6/1995 |
| KR | 10-2005-0042919 A | 5/2005 |
| KR | 10-2005-0089493 A | 9/2005 |
| KR | 10-0587006 B1 | 5/2006 |

OTHER PUBLICATIONS

Korean Office Action, and English translation thereof, issued in Korean Patent Application No. 10-2011-0113546 dated Oct. 9, 2012.

(Continued)

*Primary Examiner* — Nguyen T Ha
(74) *Attorney, Agent, or Firm* — McDermott Will & Emery LLP

(57) ABSTRACT

A multilayered ceramic electronic component includes: a ceramic element having a plurality of dielectric layers laminated therein; first inner electrodes formed on the dielectric layers disposed in upper and lower portions in the ceramic element, the width of a portion of each of the first inner electrodes exposed from one end face of the ceramic element being less than that of a portion thereof disposed within the ceramic element; and second inner electrodes formed on the dielectric layers disposed in the middle portion in the ceramic element, the width of a portion of each of the second inner electrodes exposed from one end face of the ceramic element being equal to that of a portion thereof disposed within the ceramic element.

9 Claims, 4 Drawing Sheets

(56) References Cited

U.S. PATENT DOCUMENTS

| | | | |
|---|---|---|---|
| 6,657,848 B2 * | 12/2003 | Togashi et al. | 361/306.3 |
| 7,042,706 B2 | 5/2006 | Nagai et al. | |
| 7,050,288 B2 * | 5/2006 | Ahiko et al. | 361/303 |
| 7,436,650 B2 * | 10/2008 | Oguni et al. | 361/321.2 |
| 7,551,422 B2 | 6/2009 | Togashi | |
| 7,567,425 B1 * | 7/2009 | Lee et al. | 361/306.3 |
| 8,194,390 B2 | 6/2012 | Kim et al. | |
| 8,264,815 B2 | 9/2012 | Yun et al. | |
| 8,325,462 B2 * | 12/2012 | Abe et al. | 361/303 |
| 8,351,180 B1 * | 1/2013 | Ahn et al. | 361/321.2 |

OTHER PUBLICATIONS

Entire Prosecution of U.S. Appl. No. 13/353,068, filed Jan. 18, 2012, to Lee, et al., entitled "Multilayer Ceramic Electronic Component and Fabrication Method Thereof".

* cited by examiner

MULTILAYERED CERAMIC ELECTRONIC COMPONENT AND FABRICATION METHOD THEREOF

CROSS-REFERENCE TO RELATED APPLICATIONS

This application is a Continuation of U.S. application Ser. No. 13/353,068, filed on Jan. 18, 2012, which claims priority from Korean Patent application 10-2011-0113456, filed on Nov. 2, 2011, in the Korean Intellectual Property Office, the disclosures of which are incorporated by reference.

BACKGROUND OF THE INVENTION

1. Field of the Invention

The present invention relates to a multilayered ceramic electronic component and a fabrication method thereof.

2. Description of the Related Art

Electronic components using a ceramic material include capacitors, inductors, piezoelectric elements, varistors, thermistors, and the like.

Among ceramic electronic components, a multilayered ceramic capacitor has the advantages of being small, guaranteeing high capacity, and being easily mounted.

The multilayered ceramic capacitor is a chip type condenser mounted on a circuit board of various electronic products such as computers, personal digital assistants (PDAs), mobile phones, and the like, to play a key role in storing or discharging electricity. The multilayered ceramic capacitor may have various sizes and layer lamination amounts, according to the purpose and capacity thereof.

Recently, as electronic products have been reduced in size, multilayered ceramic capacitors used in such electronic products have also been required to be smaller as well as to have a higher capacity.

Thus, a multilayered ceramic capacitor having thinned dielectric layers and inner electrodes, to reduce the overall size thereof, and having a larger number of dielectric layers laminated therein to obtain ultrahigh capacity, has been fabricated.

In order to meet the demand for a multilayered ceramic capacitor having a very small size and ultrahigh capacity, inner electrodes of a multilayered ceramic capacitor are formed on green sheets by minimizing the width of margin portions thereof.

Thus, impurities such as a conductive foreign object, moisture, ions, or the like, may infiltrate through corner portions of the inner electrode having a relatively small thickness in comparison to a central portion thereof on the surface exposing the inner electrode, to degrade insulation resistance and reliability.

Such problems may become more severe in a multilayered ceramic capacitor in which a cover layer has a small thickness and a margin portion has a narrow width.

SUMMARY OF THE INVENTION

An aspect of the present invention provides a multilayered ceramic electronic component capable of preventing impurities from infiltrating through a corner portion on a surface exposing an inner electrode of a multilayered ceramic electronic component.

According to an aspect of the present invention, there is provided a multilayered ceramic electronic component including: a ceramic element having a plurality of dielectric layers laminated therein; first inner electrodes formed on the dielectric layers disposed in upper and lower portions in the ceramic element, the width of a portion of each of the first inner electrodes exposed from one end face of the ceramic element being less than that of a portion thereof disposed within the ceramic element; and second inner electrodes formed on the dielectric layers disposed in the middle portion in the ceramic element, the width of a portion of each of the second inner electrodes exposed from one end face of the ceramic element being equal to that of a portion thereof disposed within the ceramic element.

When the width of the exposed portion of each of the first inner electrodes is c and the width of the portion thereof disposed within the ceramic element is d, the contact area ratio (c/d) of the first inner electrodes may range from 80% to 85%.

The first inner electrodes may account for 15% to 20% of the overall inner electrodes.

The first and second inner electrodes may be alternately exposed from both end faces of the ceramic element in a vertical manner.

The first inner electrodes may be formed to have a width gradually narrowed toward one end of the ceramic element.

Both corner portions of the exposed portions of the first inner electrodes may be formed to be sloped.

Each of the first inner electrodes may include: a capacitance portion disposed within the ceramic element; and a drawn portion formed to extend in parallel from one end of the capacitance portion in the exposure direction so as to be exposed from one end face of the ceramic element and have a width less than that of the capacitance portion.

The multilayered ceramic electronic component may further include first and second outer electrodes formed on both end faces of the ceramic element and electrically connected to the exposed portions of the first and second inner electrodes.

The multilayered ceramic electronic component may further include dielectric cover layers formed on upper and lower portions of the ceramic element.

According to another aspect of the present invention, there is provided a method for fabricating a multilayered ceramic electronic component, including: forming a first inner electrode film on a first ceramic sheet such that the first inner electrode film is exposed from one end face of the first ceramic sheet and the width of the exposed portion of the first inner electrode film is smaller than that of a portion thereof disposed within the first ceramic sheet; forming a second inner electrode film on a second ceramic sheet such that the second inner electrode film is exposed from one end face of the second ceramic sheet and the width of the exposed portion of the second inner electrode film is equal to that of a portion thereof disposed within the second ceramic sheet; sequentially laminating a plurality of first ceramic sheets, a plurality of second ceramic sheets, and a plurality of first ceramic sheets to form a laminated body; and firing the laminated body.

In the forming of the first inner electrode film, when the width of the exposed portion is c and the width of the portion disposed within the first ceramic sheet is d, the first inner electrode film may be formed to have a contact area ratio (c/d) ranging from 80% to 85%.

In the forming of the laminated body, the number of the first ceramic sheets and the second ceramic sheets may be adjusted in laminating the first ceramic sheets and the second ceramic sheets such that the first inner electrode film accounts for 15% to 20% of the overall inner electrode films.

In the forming of the first and second inner electrode films, the first and second inner electrode films may be formed to be alternately exposed from both end faces of the laminated body in a vertical manner.

In the forming of the first inner electrode film, the first inner electrode film may be formed to have a width gradually narrowed toward one end of the first ceramic sheet.

In the forming of the first inner electrode film, both corner portions of the exposed portion of the first inner electrode film may be formed to be sloped.

In the forming of the first inner electrode film, a capacitance portion may be formed within the first ceramic sheet, a drawn portion may be formed to extend in parallel along a connection direction to connect one end of the capacitance portion to one end face of the first ceramic sheet, and the width of the drawn portion may be adjusted to be less than that of the capacitance portion.

The method may further include: forming a pair of outer electrodes on both end faces of the laminated body to cover the first and second inner electrode films.

The method may further include: forming dielectric cover layers on upper and lower portions of the ceramic element.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
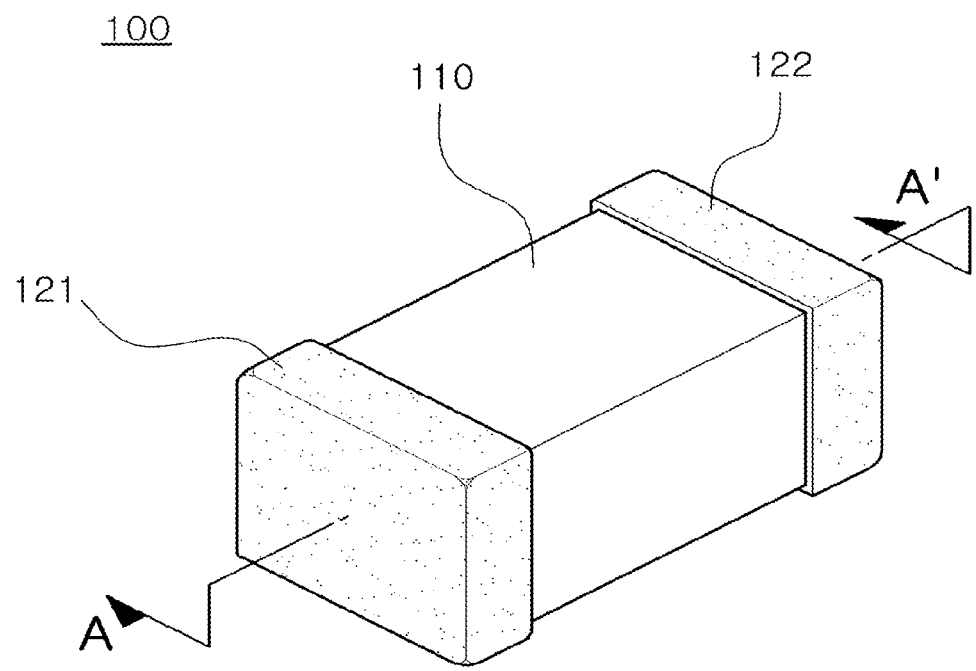
FIG. 1 is a perspective view showing a schematic structure of a multilayered ceramic capacitor according to an embodiment of the present invention.
Figure 2:
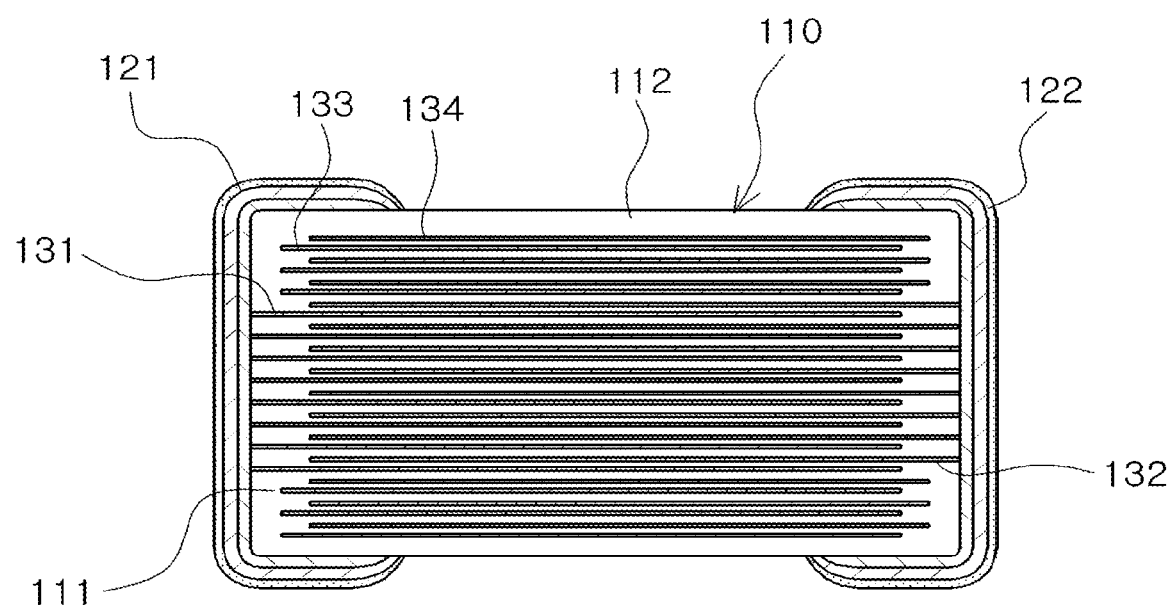
FIG. 2 is a cross-sectional view taken along line A-A' in FIG. 1.
Figure 3:
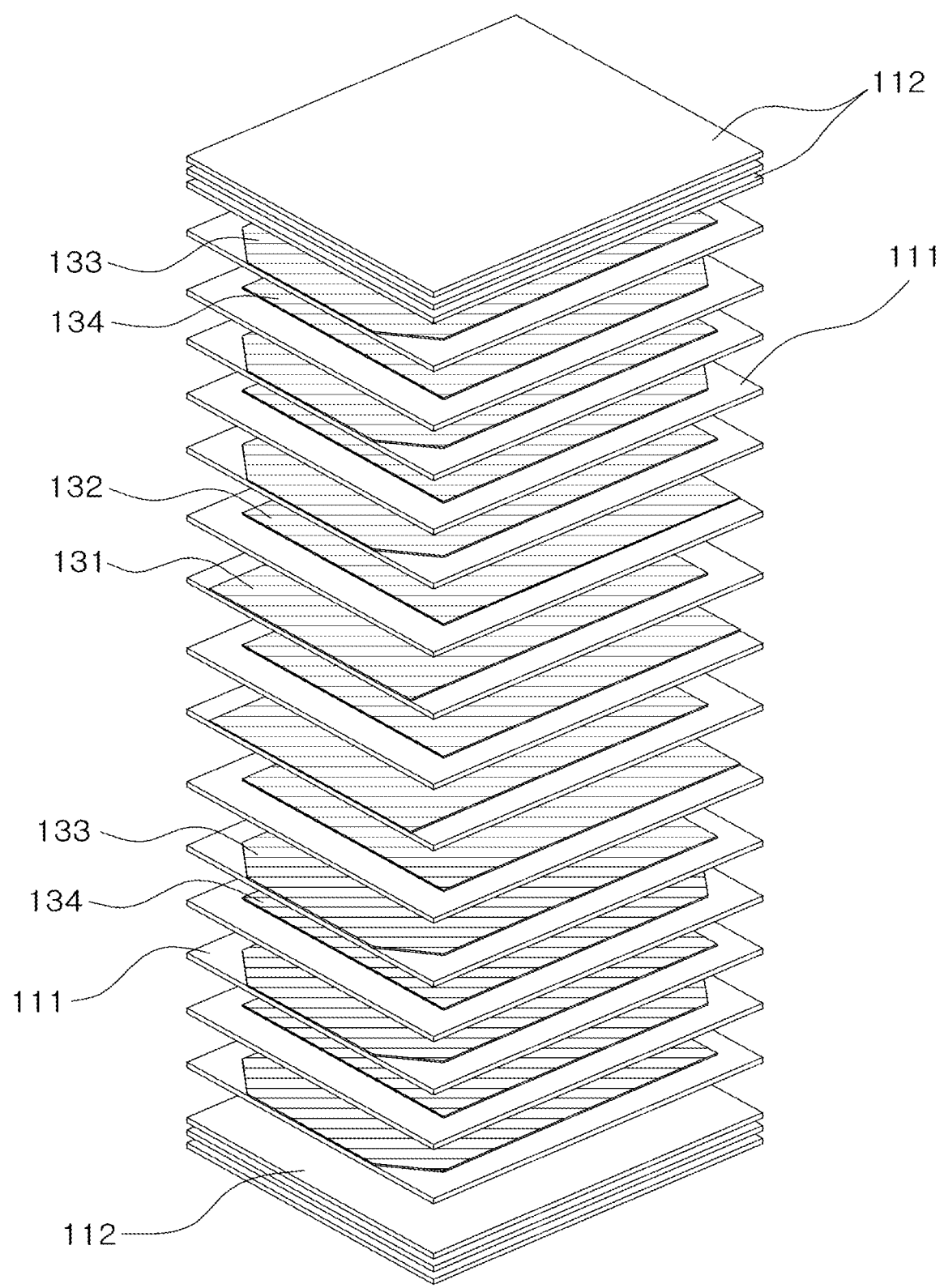
FIG. 3 is an exploded perspective view showing a dielectric layer, a first inner electrode, a second inner electrode, and a cover layer of the multilayered ceramic capacitor of FIG. 1.
Figure 4:
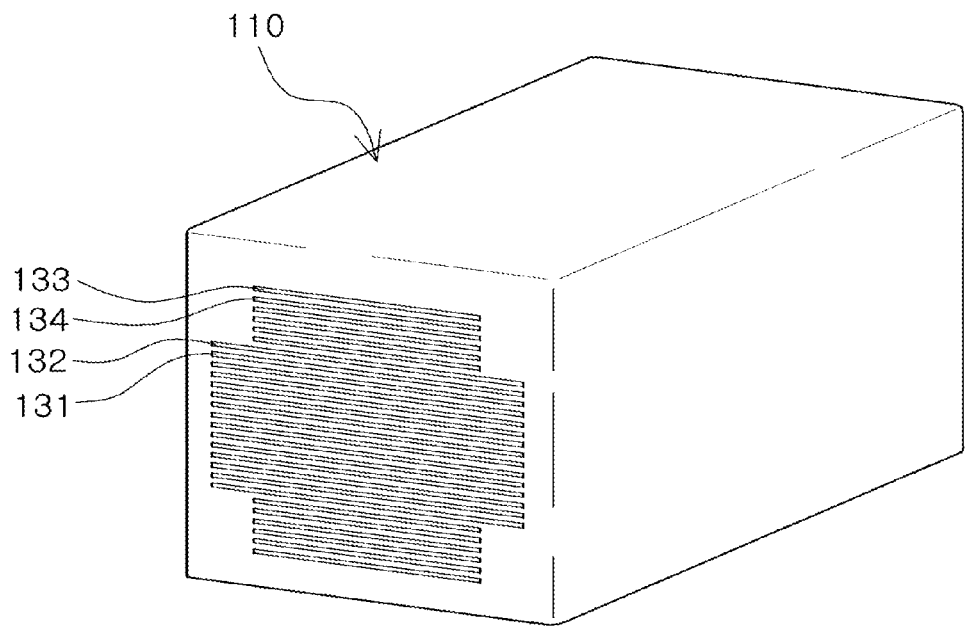
FIG. 4 is a perspective view showing a structure formed by coupling the elements of FIG. 3.
Figure 5:
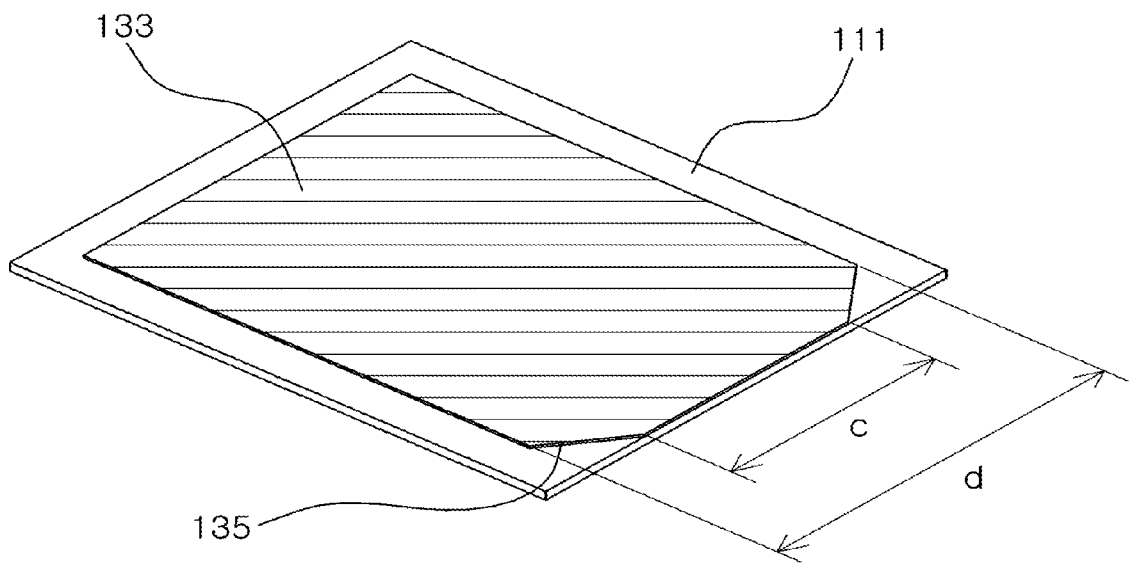
FIG. 5 is a perspective view showing the dielectric layer and the first inner electrode in FIG. 3.

Embodiments of the present invention will be described in detail with reference to the accompanying drawings.

The invention may, however, be embodied in many different forms and should not be construed as being limited to the embodiments set forth herein.

Rather, these embodiments are provided so that this disclosure will be thorough and complete, and will fully convey the scope of the invention to those skilled in the art.

In the drawings, the shapes and dimensions may be exaggerated for clarity, and the same reference numerals will be used throughout to designate the same or like components.

The same reference numerals are used for parts having similar functions and operations throughout the specification.

Throughout the specification, unless explicitly described to the contrary, the word "comprise" and variations such as "comprises" or "comprising" will be understood to imply the inclusion of stated elements but not the exclusion of any other elements.

The present invention relates to a ceramic electronic component, and the ceramic electronic component according to an embodiment of the present invention may include a multilayered ceramic capacitor, an inductor, a piezoelectric element, a varistor, a chip resistor, a thermistor, and the like. Hereinafter, a multilayered ceramic capacitor will be described as an example of a ceramic electronic product.

Also, in the present embodiment, for the sake of explanation, the faces of a ceramic element on which outer electrodes are formed will be set as left and right end faces in the following description.

With reference to FIGS. 1 through 5, a multilayered ceramic capacitor 100 according to the present embodiment includes a ceramic element 110 in which a plurality of dielectric layers 111 are laminated, a plurality of first inner electrodes 133 and 134 and a plurality of second inner electrodes 131 and 132 formed within the ceramic element 110.

The first inner electrodes 133 and 134 are formed on the dielectric layers 111 disposed at upper and lower portions in the ceramic element 110 and the width of portions of the first inner electrodes 133 and 134 exposed from one end face of the ceramic element 110 is less than the width of portions of the first inner electrodes 133 and 134 disposed at an inner side of the ceramic element 110.

The second inner electrodes 131 and 132 are formed on the dielectric layers 111 disposed in the middle of the ceramic element 110, and the width of the portions of the second inner electrodes 131 and 132 exposed from one end face of the ceramic element 110 is equal to the width of the portions of the second inner electrodes 131 and 132 disposed at the inner side of the ceramic element 110.

For example, as illustrated in the drawings of the present embodiment, the second inner electrodes 131 and 132 may be formed to have a horizontally cut plane having a rectangular shape.

Here, the first inner electrodes 133 and 134 may be set to account for 15% to 20% of the overall inner electrodes.

Also, preferably, the lamination number of the dielectric layers 111 having the first inner electrodes 133 and 134 disposed in the upper portion of the ceramic element 110 may be equal to that of the dielectric layers 111 having the first inner electrodes 133 and 134 disposed in the lower portion of the ceramic element 110, but the present invention is not limited thereto; Namely, the lamination number of the dielectric layers 111 having the first inner electrodes 133 and 134 disposed in the upper portion of the ceramic element 110 may be different from that of the dielectric layers 111 having the first inner electrodes 133 and 134 disposed in the lower portion of the ceramic element 110, as necessary.

Also, first and second outer electrodes 121 and 122 are formed on both end faces of the ceramic element 110. The first and second outer electrodes 121 and 122 are electrically connected to the exposed portions of the first inner electrodes 133 and 134 and the second inner electrodes 131 and 132.

The ceramic element 110 may be formed by laminating the plurality of dielectric layers 111.

The plurality of dielectric layers 111 constituting the ceramic element 110 may be so integrally sintered that the boundary between adjacent dielectric layers 111 cannot be noticeable.

Also, the ceramic element 110 may generally have a rectangular shape, but it is not particularly limited thereto.

Also, the ceramic element 110 may be configured to have a size of 0.6 mm×0.3 mm, or the like, to configure the multilayered ceramic capacitor 100 having a high capacity of 1.0 μF or more, but the dimensions of the ceramic element 110 is not particularly limited thereto.

Also, a dielectric cover layer 112 may be formed on the outermost faces, i.e., on the upper and lower faces in the drawings, of the ceramic element 110.

Here, two or more dielectric cover layers 112 may be laminated in a vertical direction so as to be formed.

The dielectric layers 111 constituting the ceramic element 110 may include ceramic powder, e.g., $BaTiO_3$-based ceramic powder.

The BiTiO3-based ceramic powder may include $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, or the like, but the present invention is not limited thereto.

An average particle diameter of the ceramic powder may be 0.8 μm or smaller, and preferably, ranges from 0.05 to 0.5 μm, but the present invention is not limited thereto.

The dielectric layers 111 may include at least one of a transition metal oxide, carbide, a rare earth resource, and magnesium (Mg), and aluminum (A).

The thickness of the dielectric layer 111 may be changed according to the design of capacity of the multilayered ceramic capacitor 100.

In the present embodiment, the thickness of the dielectric layer 111 may be 1.0 μm or smaller, and preferably, ranges from 0.01 μm to 1.0 μm, but the present invention is not limited thereto.

The first inner electrodes 133 and 134 and the second inner electrodes 131 and 132 may be formed with a conductive paste including conductive metal.

Here, the conductive metal may be nickel (Ni), copper (Cu), palladium (Pd), or an alloy thereof, but the present invention is not limited thereto.

A conductive paste may be printed on the ceramic green sheets forming the dielectric layers 111 through a screen printing method or a Gravure printing method to form inner electrode layers including the first inner electrodes 133 and 134 and the second inner electrodes 131 and 132, and the ceramic green sheets with the inner electrode layers formed thereon are alternately laminated and fired to form the ceramic element 110.

Thus, capacitance is formed in the region in which the first inner electrodes 133 and 134 and the second inner electrodes 131 and 132 overlap.

Here, the first inner electrodes 133 and 134 and the second inner electrodes 131 and 132, having the mutually different polarity, may be alternately exposed from both end faces of the ceramic element 110 in a vertical manner.

The thickness of the first inner electrodes 133 and 134 and the second inner electrodes 131 and 132 may be determined according to a purpose. For example, the thickness of the first inner electrodes 133 and 134 and the second inner electrodes 131 and 132 may be determined to range from 0.2 μm to 1.0 μm in consideration of the size of the ceramic element 110, but the present invention is not limited thereto.

In forming the first inner electrodes 133 and 134 and the second inner electrodes 131 and 132 on the dielectric layers 111, in order to prevent impurities such as a conductive foreign object, moisture, ions, or the like, from infiltrating into the first inner electrodes 133 and 134 and the second inner electrodes 131 and 132 and prevent an electrical short-circuit, a certain margin portion may remain between the dielectric layers 111 and the first inner electrodes 133 and 134 and the second inner electrodes 131 and 132.

Thus, in order to electrically connect the first inner electrodes 133 and 134 and the second inner electrodes 131 and 132 to the first and second outer electrodes 121 and 122 formed on one side of the dielectric layer 111 and having mutually different polarities, connection portions are formed, extending from one front end of each of the first inner electrodes 133 and 134 and the second inner electrodes 131 and 132 to the end faces of the ceramic element 110 on which the first and second outer electrodes 121 and 122 are formed, on the margin portion of the dielectric layers 111.

Here, the second inner electrodes 131 and 132 are formed such that portions thereof disposed within the ceramic element 110 have the same width as that of the connection portions.

Meanwhile, the first inner electrodes 133 and 134 are formed such that the width of the front ends exposed from one end face of the ceramic element 110 is less than the portions of the first inner electrodes 133 and 134 disposed within the ceramic element 110.

In the present embodiment, the connection portions may be configured to have a tapered shape such that the width thereof is gradually reduced toward one end of the ceramic element 110, and for the tapered shape, for example, both corner portions of the connection portions may be formed as sloped faces 135.

Also, in order to obtain an optimum production yield by minimizing defective contact and crack generation due to infiltration of a plating solution in the first inner electrodes 133 and 134, the first inner electrodes 133 and 134 may be configured such that the ratio of the portions thereof exposed from one end face of the ceramic element 110 to the portions thereof disposed within the ceramic element 110 is 80% to 85%.

The operation of the multilayered ceramic capacitor 100 configured as described above according to the present embodiment will be explained.

The dielectric layers 110 have a certain margin portion between the dielectric layers 110 and the inner electrodes.

The margin portion may serve to prevent a foreign object from infiltrating into the inner electrodes after the ceramic element 110 is formed by laminating the respective dielectric layers 111 and also serve to protect the inner electrodes against external impacts to thus prevent an electrical short-circuit.

Also, the margin portion is formed to be as small as possible in order to maximize capacitance of the inner electrodes to thus obtain a multilayered ceramic capacitor 100 which is compact and has high capacity.

Here, impurities such as a conductive foreign object, moisture, ions, or the like, may infiltrate through the corner portion having a relatively small thickness in comparison to the central portion from one end face of the ceramic element 110 exposing the inner electrodes, to degrade insulation resistance, reliability, or the like.

Here, such a problem may be solved when the first inner electrodes 133 and 134 are formed on the all of the dielectric layers 111 because the width of the margin portion is increased.

In this case, however, step influence on the corner portion may be increased and a movement of a material to a step portion is insufficient in a compression step, lowering the density of the margin portion to result in crack generation.

Also, the inner electrodes extend to fill the empty step portion, aggravating disconnection of the inner electrodes to degrade reliability.

However, as for the multilayered ceramic capacity 100 according to the present embodiment, in forming the ceramic element 110 by forming the plurality of inner electrodes on the dielectric layers 111 and laminating the dielectric layers 111, the first inner electrodes 133 and 134 may be formed on the dielectric layers 111 disposed in the upper and lower portions in the ceramic element 110 and the second inner electrodes 131 and 132 may be formed on the dielectric layers 111 disposed in the middle of the ceramic element 110.

Namely, the margin portion is in the corner portions of the ceramic element 110, allowing the inner electrodes to be disposed at a position spaced apart from the corner portions which make a main infiltration path of a foreign object, thus preventing a foreign object from infiltrating into the inner electrodes.

Also, the second inner electrodes 131 and 132 are disposed in the middle portion of the ceramic element 110 into which a foreign object can rarely infiltrate relatively, to serve to maintain connectivity of the electrodes.

Thus, with such a structure, the ultrahigh capacity multilayered ceramic capacitor 100, which maintains the electrode connectivity, has a narrow margin, includes thinner covers, can have low probability in which a conductive foreign material infiltrates into the corner portions coated with thin outer electrodes, thus having enhanced reliability.

In order to maximize such an effect, the first inner electrodes 133 and 134 may be set to account for 15% to 20% of the overall inner electrodes.

Also, preferably, the lamination number of the dielectric layers 111 having the first inner electrodes 133 and 134 disposed in the upper portion of the ceramic element 110 may be equal to that of the dielectric layers 111 having the first inner electrodes 133 and 134 disposed in the lower portion of the ceramic element 110, but the present invention is not limited thereto; namely, the lamination number of the dielectric layers 111 having the first inner electrodes 133 and 134 disposed in the upper portion of the ceramic element 110 may be different from that of the dielectric layers 111 having the first inner electrodes 133 and 134 disposed in the lower portion of the ceramic element 110, as necessary.

An Embodiment Example of the present invention and Comparative Example will be described in detail with reference to Table 1 shown below.

In the Embodiment Example of the present invention, the first inner electrodes 133 and 134 are formed on the plurality of dielectric layers 111 disposed in the upper and lower portions in the ceramic element 110, and the second inner electrodes 131 and 132 are formed on the plurality of dielectric layers 111 disposed in the middle of the ceramic element 110.

In the Comparative Example, the first inner electrodes 133 and 134 are formed on all of the dielectric layers 111 of the ceramic element 110.

Here, the dielectric layers 111 were configured as ceramic sheets, and when the thickness of each of the sheets was 0.5 μm, a lamination number of the dielectric layers was set to be 500, when the thickness of each of the sheets was 0.7 μm, a lamination number of the dielectric layers was set to be 400, and when the thickness of each of the sheets was 1.0 μm, a lamination number of the dielectric layers was set to be 300.

The thicknesses of both of the first inner electrodes 133 and 134 and the second inner electrodes 131 and 132 were set to be 0.5 μm, and a step rate was calculated to be (electrode thickness×lamination number)/((sheet thickness electrode thickness)×lamination number).

TABLE 1

|  | Sheet thickness | Lamination number | Step rate (%) | Note |
|---|---|---|---|---|
| Comparative Example | 0.5 | 500 | 50.5% | Electrode thickness: 0.5 |
|  | 0.7 | 400 | 41.7% |  |
|  | 1 | 300 | 33.3% |  |
| Embodiment Example | 0.5 | 500 | 33.0% |  |
|  | 0.7 | 400 | 27.8% |  |
|  | 1 | 300 | 22.2% |  |

<Step rate of multilayered ceramic capacitor according to lamination structure of first electrodes>

With reference to FIG. 1, it is noted that the step rate of the Embodiment Example is reduced by about 30% in comparison to that of the Comparative Example, regardless of the thickness and lamination number of the ceramic sheets.

Thus, when the ceramic element 110 is configured to have a structure in which the first inner electrodes 133 and 134 are laminated in the lower portion thereof, the second inner electrodes 131 and 132 are laminated in the middle portion thereof, and the first inner electrodes 133 and 134 are laminated in the upper portion thereof as in the Embodiment Example, generation of delamination and cracks in the multilayered ceramic capacitor 100 due to a low step rate can be more effectively prevented.

Table 2 below shows percentage by volume, and contact generation frequency of multilayered ceramic capacitors according to a contact area ratio (c/d) of the first inner electrodes 133 and 134 when a width of an exposed portion of the first electrodes 133 and 134 is c and a width of a capacitance portion of the first inner electrodes 133 and 134 is d.

For the evaluation, the first and second inner electrode films were printed on a plurality of ceramic sheets, and the plurality of ceramic sheets were laminated such that the ceramic sheets having the second inner electrode films printed thereon were disposed in the middle portion, and then fired, and thereafter, the first and second outer electrodes 121 and 122 are formed on both end faces of the laminated body, and then, the lamination was cut according to each size to fabricate respective chips.

Here, the sizes of the chips varied to be 1005, 1608, 2012, and 3216. A design margin rate, a round abrasion rate, a seal margin rate, an optimum bottleneck rate, and lamination number were variably changed according to the various sizes of the chips to change the contact area ratio into various numerical values, and then, the percentage by volume and contact generation frequency of the respective chips were checked.

TABLE 2

| MLCC size | W size | Design margin rate | Round abrasion rate | Seal margin rate | Optimum bottleneck rate | Layer number | Contact area ratio ((c)/(d)) | Percentage by volume | Contact generation frequency |
|---|---|---|---|---|---|---|---|---|---|
| 1005 | 500 μm | 25% | 5% | 24% | 15% | 200L | 74% | 99.3% | 514 PPM |
|  |  |  |  |  |  |  | 80% | 99.5% | 311 PPM |
|  |  |  |  |  |  |  | 85% | 99.8% | 15 PPM |

TABLE 2-continued

<Percentage by volume and contact generation frequency of multilayered ceramic capacitor according to contact area ratio of first inner electrodes>

| MLCC size | W size | Design margin rate | Round abrasion rate | Seal margin rate | Optimum bottleneok rate | Layer number | Contact area ratio ((c)/(d)) | Percentage by volume | Contact generation frequency |
|---|---|---|---|---|---|---|---|---|---|
| 1608 | 800 μm | 23% | 10% | 20% | 25% | 250L | 90% | 99.9% | 12 PPM |
|  |  |  |  |  |  |  | 70% | 99.5% | 217 PPM |
|  |  |  |  |  |  |  | 75% | 99.5% | 10 PPM |
|  |  |  |  |  |  |  | 85% | 101.3% | 8 PPM |
| 2012 | 1200 μm | 15% | 12% | 13% | 30% | 300L | 63% | 99.6% | 81 PPM |
|  |  |  |  |  |  |  | 70% | 99.5% | 8 PPM |
|  |  |  |  |  |  |  | 85% | 99.4% | 8 PPM |
| 3216 | 1600 μm | 13% | 13% | 10% | 30% | 350L | 60% | 99.8% | 52 PPM |
|  |  |  |  |  |  |  | 70% | 99.5% | 8 PPM |
|  |  |  |  |  |  |  | 85% | 99.9% | 5 PPM |

With reference to Table 2, it is noted that, in the case of the chips having the small sizes of 1005 and 1608, respectively, the percentage by volume was increased according to an increase in the contact area ratio, and even in the case of the chips having the sizes of 2012 and 3216, respectively, the percentage by volume was partially changed according to an increase in the contact area ratio.

However, the numerical value of change in the percentage by volume over the contact area ratio was not so great, so in this evaluation, only the contact generation frequency was determined as a reference of determining a defective product.

It is noted that, in the case of the chip having the size of 1005, when the contact area ratio was 85%, the contact generation frequency was drastically reduced from 311 ppm to 15 ppm, and in the case of the chip having the size of 1608, when the contact area ratio was 85%, the contact generation frequency was reduced from 10 ppm to 8 ppm.

Also, it is noted that, in the case of the chip having the size of 2012, when the contact area ratio was 70%, the contact generation frequency was drastically reduced from 81 ppm to 8 ppm, and when the contact area ratio was 85%, the contact generation frequency was further reduced to 6 ppm.

Also, it is noted that, in the case of the chip having the largest size of 3216, when the contact area ratio was 70%, the contact generation frequency was drastically reduced from 52 ppm to 8 ppm, and when the contact area ratio was 85%, the contact generation frequency was further reduced to 5 ppm.

Thus, in Table 2, as the contact area ratio of the first inner electrodes 133 and 134 was converged into 85%, defective contact and crack generation due to infiltration of a plating solution are minimized, obtaining the optimum production yield, so a desirable numeral value range of the contact area ratio (c/d) of the first inner electrodes 133 and 134 may be determined to be 80% to 85%.

Figure 6:
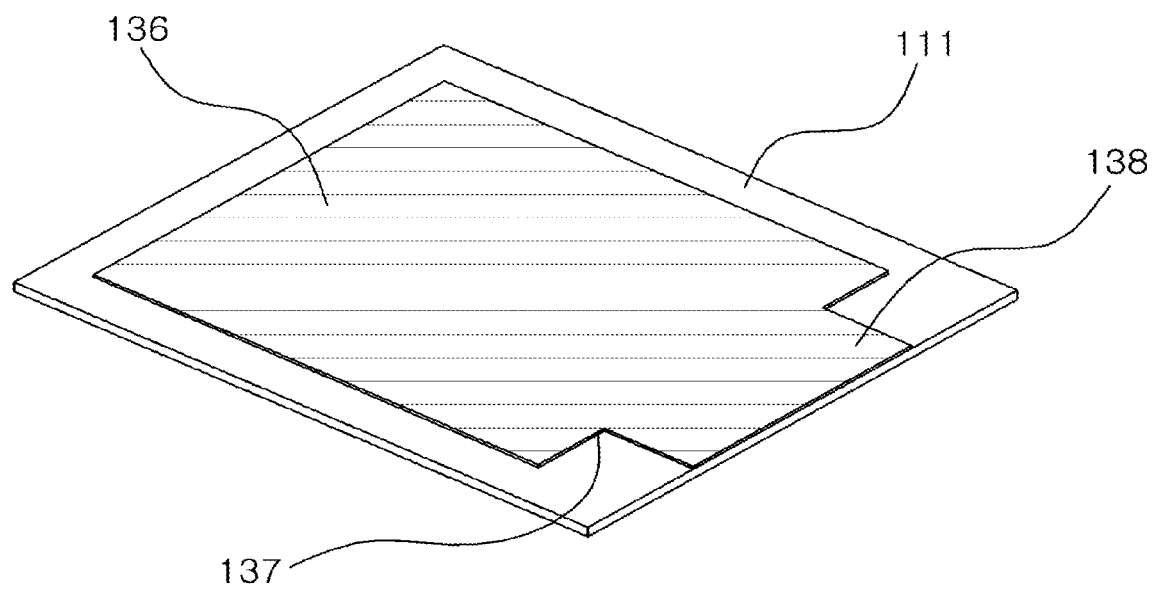
FIG. 6 is a perspective view showing a dielectric layer and a first inner electrode of a multilayered ceramic capacitor according to another embodiment of the present invention.

Meanwhile, in another embodiment of the present invention, with reference to FIG. 6, a first inner electrode may include a capacitance portion 136 disposed within the ceramic element 110 to secure capacitance and a drawn portion 138 formed on a margin portion to allow the first inner electrode to be exposed from one end face of the ceramic element 110.

Here, both corner portions of the drawn portion 138 has a step portion 137, so the drawn portion 138 may have a width less than that of the capacitance portion 136.

Also, the drawn portion 138 may extend from one end of the capacitance portion 136 such that it is parallel to the exposure direction, so the step portion 137 has an "L"-like shape.

Hereinafter, a method for fabricating the multilayered ceramic capacitor 100 according to an embodiment of the present invention will be described.

A plurality of ceramic green sheets are prepared.

The ceramic green sheets are used to form the dielectric layers 11 of the ceramic element 110, and in order to form the ceramic green sheets, ceramic powder, polymer, and a solvent may be mixed to fabricate slurry, and the slurry may be formed into a sheet having a few μm thickness through a technique such as a doctor blade technique, or the like.

Thereafter, conductive paste is printed to have a predetermined thickness, e.g., a thickness ranging from 0.2 μm to 1.0 μm, on at least one surface of each of the ceramic green sheets to form first and second inner electrode films.

The conductive paste may be printed such that the first and second inner electrode films are formed at an inner side of each of the ceramic green sheets and a margin portion is formed to have a predetermined thickness along the edge of each of the ceramic green sheets.

The first inner electrode film is formed on a first ceramic sheet and exposed from one end face of the first ceramic sheet, and here, the width of the exposed portion of the first inner electrode film is less than that of the portion thereof disposed at the inner side of the first ceramic sheet.

To this end, the first inner electrode film may be formed to have a width gradually narrowed toward one end face of the first ceramic sheet, namely, for example, both corner portions of the exposed portion of the first inner electrode film may be formed to be sloped.

In another example, the capacitance portion of the first inner electrode film may be formed at the inner side of the first ceramic sheet and a drawn portion may be formed to extend in parallel in a connection direction to connect one end of the capacitance portion to one end face of the first ceramic sheet.

Here, in order to obtain an optimum production yield by minimizing defective contact and crack generation due to infiltration of a plating solution in the first inner electrode films, the first inner electrode films may be configured such that the contact area ratio (c/d) is 80% to 85% when the width of the exposed portion is c and that of the portion disposed at the inner side thereof is d.

The second inner electrode film is formed on a second ceramic sheet and exposed from one end face of the second ceramic sheet, and here, the width of the exposed portion may be equal to that of the portion disposed at the inner side thereof.

In order to print the conductive paste, a screen printing method, a Gravure printing method, or the like, may be used, and the conductive paste may include metal powder, ceramic powder, silica ($SiO_2$) powder, and the like.

An average particle diameter of the conductive paste may range from 50 nm to 400 nm, and the present invention is not limited thereto.

Also, the metal powder may be one of nickel (Ni), manganese (Mn), chromium (Cr), cobalt (Co), and aluminum (Al), or an alloy thereof.

Thereafter, a plurality of the first ceramic sheets are laminated, a plurality of the second ceramic sheets are laminated on the plurality of first ceramic sheets, and then, the plurality of the first ceramic sheets and the plurality of the second ceramic sheets are pressed in the lamination direction to compress the plurality of the laminated ceramic green sheets and the conductive paste formed on each of the ceramic green sheets.

Accordingly, the laminated body in which the plurality of first inner electrodes 133 and 134, the plurality of second inner electrodes 131 and 132, and the plurality of first inner electrodes 133 and 134 are disposed in sequence vertically from the above can be formed.

Here, in the laminated body, in laminating the first inner electrode films, the number of the first ceramic sheets and the second ceramic sheets may be adjusted such that the first inner electrode films account for 15% to 20% of the overall inner electrode films.

Also, one or more dielectric cover layers 112 may be further laminated on upper and lower portions of the laminated body.

The dielectric cover layers 112 may have the same composition as that of the dielectric layers 111 and may be different from the dielectric layers 111, in that the dielectric cover layers 112 do not include an inner electrode.

Thereafter, the laminated body is cut at every region corresponding to one capacitor to form chips, and the chips are fired at a high temperature to thus complete the ceramic element 110.

Thereafter, the first and second outer electrodes 121 and 122 may be formed on both end faces of the ceramic element 110 to cover the first and second inner electrode films so as to be electrically connected thereto.

Here, the surfaces of the first and second outer electrodes 121 and 122 may be plated with nickel (Ni), tin (Sn), or the like, as necessary.

As set forth above, according to embodiments of the invention, a certain contact area is maintained to prevent a defective contact between outer electrodes and inner electrodes, and infiltration of impurities such as a conductive foreign object, moisture, ions, or the like, through corner portions of the electrodes is prevented, thus preventing degradation of insulation resistance and reliability.

While the present invention has been shown and described in connection with the embodiments, it will be apparent to those skilled in the art that modifications and variations can be made without departing from the spirit and scope of the invention as defined by the appended claims.

What is claimed is:

1. A multilayered ceramic electronic component comprising:
    a ceramic element having a plurality of dielectric layers laminated therein;
    first inner electrodes formed on the dielectric layers disposed in upper and lower portions in the ceramic element and exposed to one end face of the ceramic element; and
    second inner electrodes formed on the dielectric layers disposed in the middle portion in the ceramic element and exposed to one end face of the ceramic element; and
    wherein a portion exposed by the second inner electrodes has a width greater than a portion exposed by the first inner electrodes.

2. The multilayered ceramic electronic component of claim 1, wherein when the width of the exposed portion of each of the first inner electrodes is c and the width of the portion thereof disposed within the ceramic element is d, the contact area ratio (c/d) of the first inner electrodes ranges from 80% to 85%.

3. The multilayered ceramic electronic component of claim 1, wherein the first inner electrodes accounts for 15% to 20% of the overall inner electrodes.

4. The multilayered ceramic electronic component of claim 1, wherein the first and second inner electrodes are alternately exposed from both end faces of the ceramic element in a vertical manner.

5. The multilayered ceramic electronic component of claim 1, wherein the first inner electrodes are formed to have a width gradually narrowed toward one end of the ceramic element.

6. The multilayered ceramic electronic component of claim 5, wherein both corner portions of the exposed portions of the first inner electrodes are formed to be sloped.

7. The multilayered ceramic electronic component of claim 1, wherein each of the first inner electrodes comprises:
    a capacitance portion disposed within the ceramic element; and
    a drawn portion formed to extend in parallel from one end of the capacitance portion in the exposure direction so as to be exposed from one end face of the ceramic element and have a width less than that of the capacitance portion.

8. The multilayered ceramic electronic component of claim 1, further comprising first and second outer electrodes formed on both end faces of the ceramic element and electrically connected to the exposed portions of the first and second inner electrodes.

9. The multilayered ceramic electronic component of claim 1, further comprising: dielectric cover layers formed on upper and lower portions of the ceramic element.

* * * * *